United States Patent [19]  
Ohgami et al.

[11] Patent Number: 4,569,717  
[45] Date of Patent: Feb. 11, 1986

[54] METHOD OF SURFACE TREATMENT

[75] Inventors: Nobutoshi Ohgami; Masaru Kitagawa, both of Hikone; Hisao Nishizawa, Inugami; Masakazu Saita, Yasu, all of Japan

[73] Assignee: Dainippon Screen Mfg. Co., Ltd., Kyoto, Japan

[21] Appl. No.: 611,420

[22] Filed: May 17, 1984

[30] Foreign Application Priority Data

May 24, 1983 [JP] Japan ............................ 58-92176
Oct. 6, 1983 [JP] Japan ............................ 58-188035

[51] Int. Cl.[4] .................... G01T 1/185; H01L 21/306
[52] U.S. Cl. ........................ 156/626; 356/72; 356/381; 356/382; 250/227; 250/559; 430/30
[58] Field of Search ............ 250/227, 559; 156/626, 156/627; 356/72, 381, 382; 430/30

[56] References Cited

U.S. PATENT DOCUMENTS

| 3,874,959 | 4/1975 | Hoekstra et al. | 156/7 |
| 4,039,370 | 8/1977 | Kleinknecht | 156/626 |
| 4,142,107 | 2/1979 | Hatzakis et al. | 250/571 |
| 4,479,848 | 10/1984 | Otsubo et al. | 156/626 |
| 4,491,499 | 1/1985 | Jerde et al. | 156/626 |

FOREIGN PATENT DOCUMENTS 56-158872 3/1981 Japan .

OTHER PUBLICATIONS

"Process Detection System" by D. H. Jurczyk et al., published in IBM Technical Disclosure Bulletin, vol. 18, No. 6, Nov. 1975.

Primary Examiner—Shrive P. Beck  
Attorney, Agent, or Firm—Brumbaugh, Graves, Donohue & Raymond

[57] ABSTRACT

In a method of surface treatment irradiating a part of a plate to be treated with light flux, detecting a quantity of transmitted light or reflected light on the plate corresponding to the light flux, detecting an end point of surface treatment based on the variation in the detected signal level the combination with the method of a step of detecting whether the detected signal level exceeds a predetermined target level within a predetermined period of time, a step of repeatedly setting up a new target level so long as the detected level is found exceeding the predetermined target level, and a step of determining the end point of the surface treatment at the moment when the detected signal level is found not exceeding the new target level.

8 Claims, 18 Drawing Figures

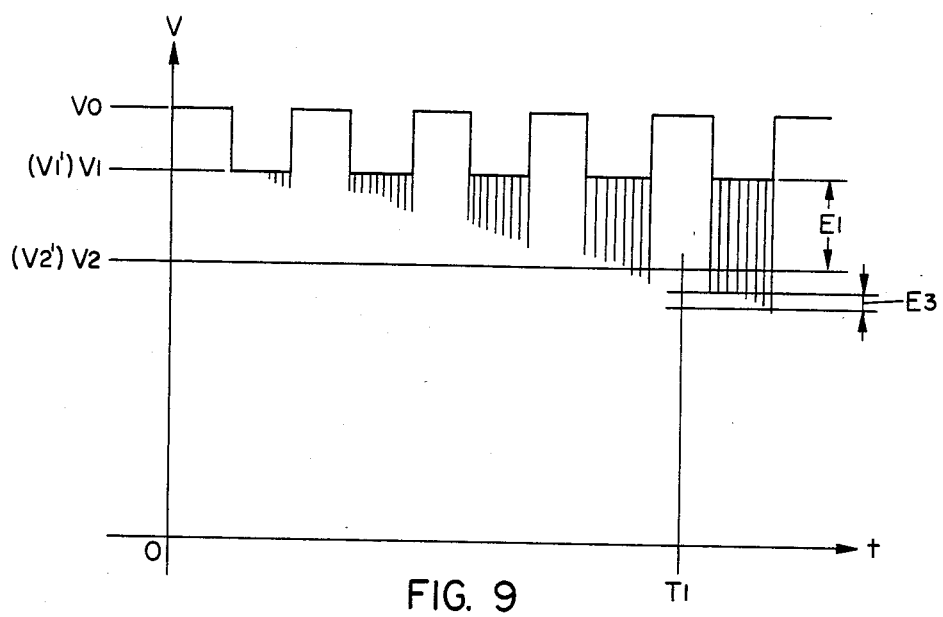
FIG. 9
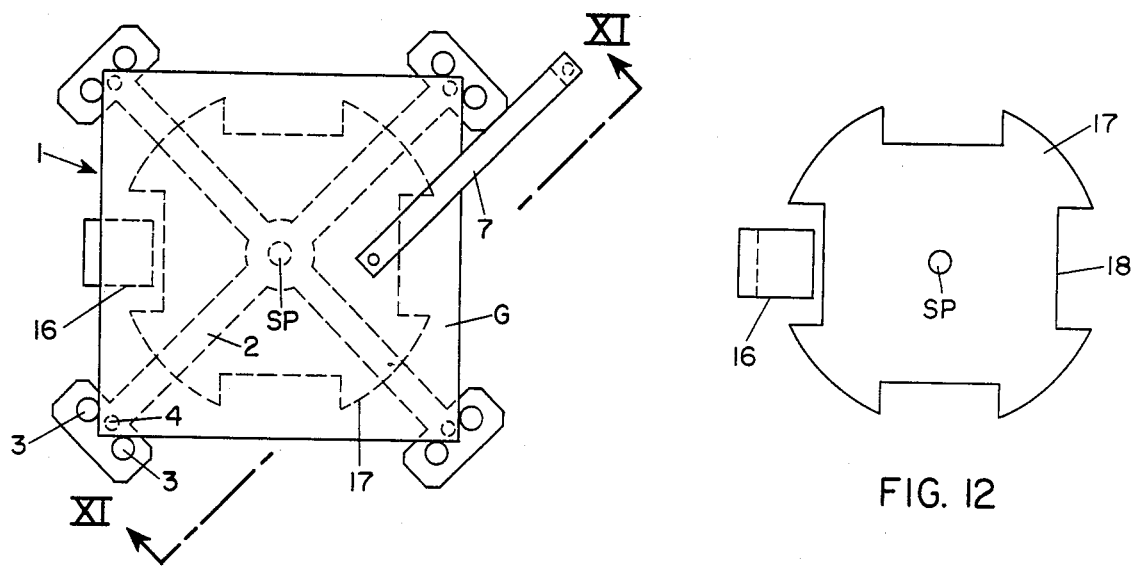
FIG. 10
FIG. 12
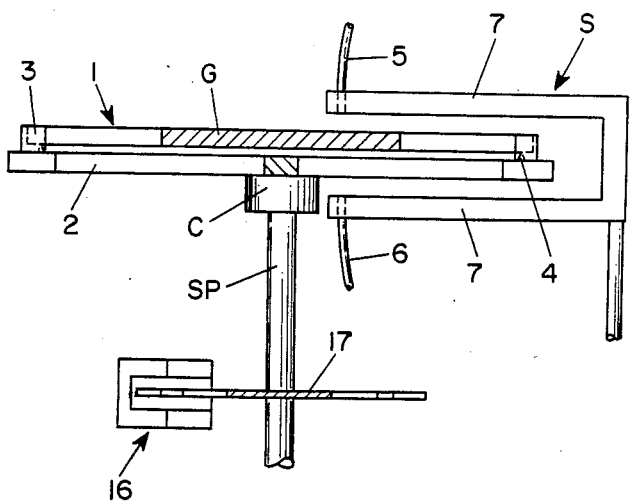
FIG. 11

4,569,717

METHOD OF SURFACE TREATMENT

BACKGROUND OF THE INVENTION

This invention relates to a method of automatically detecting a state of surface treatment of a base plate such as etching in the production of photomask and, in particular, to a method of automatically detecting an end point of the treatment.

The photomask used for the production of semiconductors is generally produced by a known method comprising a process of applying photoresist to the base plate of glass or the like to the surface of which some metal is applied by means of vapor deposition, a process of making said photoresist film into a pattern by exposing a mask pattern onto the photoresist film and then developing the same using an applicable developing solution, and a process of etching the metallic film exposed by the development.

A high degree of accuracy is required particularly in the process of etching of all others in the production of photomask, and accordingly it is indispensable to accurately control the end point of the etching process. Thus, several attempts have been proposed for detecting the end point to a high degree of accuracy. According to the Japanese Patent Application laid open under Provisional Publication No. Sho 56-158872, for example, a method is proposed in which a region for measuring light transmittance is provided outside an effective area on the surface of the photomask to detect the progress of etching process and the light transmittance of said region being measured to detect the end point of etching based on the measured result.

Said prior invention, however, as a method of detecting the end point of etching process, employs an averaging method wherein the difference between the sampling values taken before and after the transmittance of light respectively, is averaged at the consecutive 10 points or so. Hence there is a problem that when the progress of etching is temporally stopped, for example, in the event of remaining a refractory oxide film on the metallic film formed by means of vapor deposition, it is likely to erroneously take said temporal stoppage for the end point before coming to the actual end point of the etching process. Also there exists another disadvantage that since the quantity of transmitted light on the base plate of glass to which a metallic film is applied by means of vapor deposition is variable depending upon the kind of metal, existence of some oxide film thereon, the characteristic of the glass base plate, the thickness thereof, etc., an accurate detection of the end point of the etching process is almost impossible so far as using said averaging method.

Further, in order to hold the glass base plate on the rotational treatment device (spinner) during the surface treatment, it is known to adopt either a vacuum suction device making use of a vacuum chuck of the spinner head or a simple stationary arm holder which holds the four corners of the base plate.

When the spinner head of the simple stationary arm holder is used, there exists a disadvantage that the arm holding the four corners of glass base plate intermittently interrupts the light flux or beam of which transmitted quantity on the base plate must be detected, making it further difficult to accurately detect the end point of etching process so long as using such averaging method.

SUMMARY OF THE INVENTION

In order to solve the above-discussed problems or disadvantages of the prior arts, an object of this invention is to provide a novel method of accurately detecting the end point of the surface treatment such as etching even in case of a holding means using spinner head having the stationary arm holder or in case of a photomask having any characteristic in the quantity of transmitted light thereof.

This invention, as illustrated in FIG. 1 (i) to (iv), is based on the principle and knowledge that although the quantity of transmitted light on each plate to be treated varies at the initial stage of etching treatment, each characteristic of the quantity of transmitted light comes to be almost similar with the progress of the treatment.

Thus, in accordance with this invention, there is provided a method of detecting the state of surface treatment of a plate to be treated by detecting a quantity of transmitted light or a quantity of reflected light on the plate using photoelectric transfer elements and based on the variation in the levels thus detected, the combination with said method of a step of detecting whether said actually detected level exceeds a predetermined level or not within a predetermined time, a step of setting a new target level in order with gradual step so long as the detected level is found exceeding the predetermined target level, a step of repeatedly detecting the variation in the detected levels, and a step of determining an end point of the surface treatment at the moment when the detected level is found not exceeding the predetermined target level within the predetermined time.

According to the foregoing method, however, as it is impossible to confirm whether the surface treatment proceeds evenly throughout the whole surface of the plate to be treated, it may still remain a problem that even when the surface treatment is performed only in some part of the plate, the end point is erroneously determined by the detection thereof.

Thus, in order to overcome said problem, in accordance with this invention, there is also provided another method of detecting the state of surface treatment on the plate to be treated by detecting a quantity of transmitted light or a quantity of reflected light using photoelectric transfer elements and based on the variation in the levels thus detected, the combination with said method of a step of detecting whether said detected level exceeds a predetermined target level or not consecutively at a predetermined frequency within a predetermined period of time, a step of setting up a next new target level so long as the detected level is found exceeding the predetermined target level, a step of detecting whether the detected level exceeds the newly-setup target level or not, and a step of determining an end point of the surface treatment at the moment when the detected level is found not exceeding the predetermined target level consecutively at a predetermined frequency within a predetermined period of time.

By the formation above-described, even in case of the surface treatment while holding the plate to be treated onto the spinner head having stationary arm holders, it can be accurately detected whether every detected signal level of each divisional region of the plate divided by said arm holders exceeds the target level or not, thereby the end point of the surface treatment being accurately detected throughout the every region.

Further, in accordance with this invention, by setting up an initial target level having enough tolerance, even when the characteristic of the quantity of transmitted light in the surface treatment varies to a great extent, the state of the treatment can be accurately detected irrespective of such variation. In addition, by setting up the target level with gradual step along with the progress of the surface treatment so that the target level is compared with the detected signal level, the accuracy in detecting the end point of the surface treatment can be further improved. Furthermore, by adopting a formation in which a target level to be set up can be changed corresponding to the variation in the detected levels during the period from the start of the surface treatment to the predetermined moment, the detection can be accomplished appropriately corresponding to the progress of the surface treatment.

Other objects, features and advantages of this invention will become apparent in the course of the following description with the accompanying drawings.

BRIEF DESCRIPTION OF THE DRAWINGS

In the accompanying drawings forming a part of this invention, and in which like parts are designated reference numerals or characters throughout the same.

FIG. 9 is a diagram showing wave-form characteristics of detected signals output by photoelectric transfer elements;

FIG. 10 is a plan view showing another mode of the simple spinner head;

FIG. 11 is a sectional side elevation taken on the plane of line XI—XI and viewed in the direction of arrows;

FIG. 12 is a plan view showing one embodiment of a means of generating gate signals provided on the spinner head;

DESCRIPTION OF THE PREFERRED EMBODIMENTS

Figure 3:
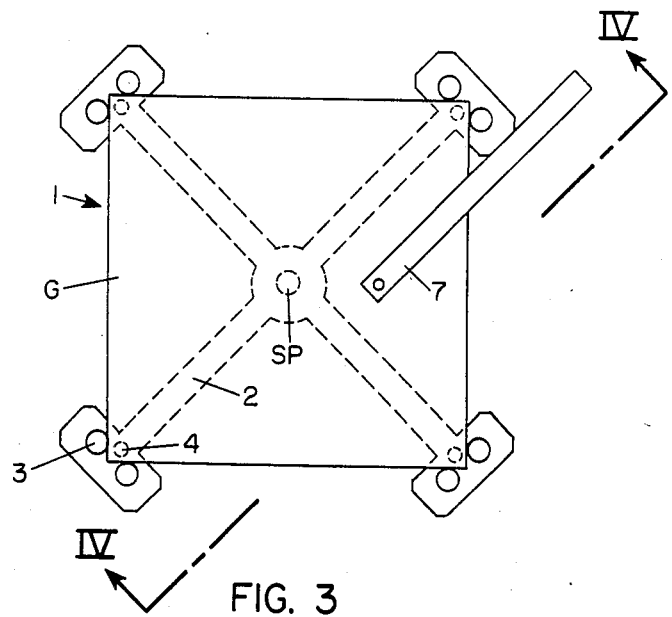
FIG. 3 is a plan view showing an example of a simple spinner head.
Figure 4:
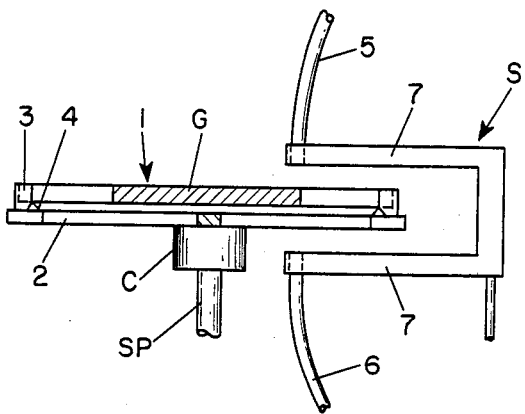
FIG. 4 is a sectional side elevation taken on the plane of line IV—IV of FIG. 3 and viewed in the direction of arrows.

Referring to FIGS. 3 and 4 illustrating an example of a spinner head of the stationary arm holder, the former being a plan view thereof and the latter being a sectional side elevation taken on the plane of line IV—IV of the former viewed in the direction of arrows, a plate (1) to be treated is formed by a method comprising a process of applying a metallic film to the surface of a plate of a glass or a semiconductor plate (G) of silicon, etc., by means of vapor deposition, a process of forming a photoresist film by applying photoresist to the metallic film and drying it, a process of printing a predetermined pattern onto the photoresist film, and a process of developing thereof.

The spinner head comprises a central part (C) coaxially coupled with a spindle (SP), arms (2) provided radially from said central part (C) at the spacing of equal angle on the same horizontal plane, a pair of pins (3) for holding the plate provided on the surface of the end part of said arms (2), and pins (4) for placing the plate. The plate (1) to be treated is placed on the pins (4) so as to be rotated or turned on the horizontal plane while being held by the pins (3) at every four corner.

Figure 5:
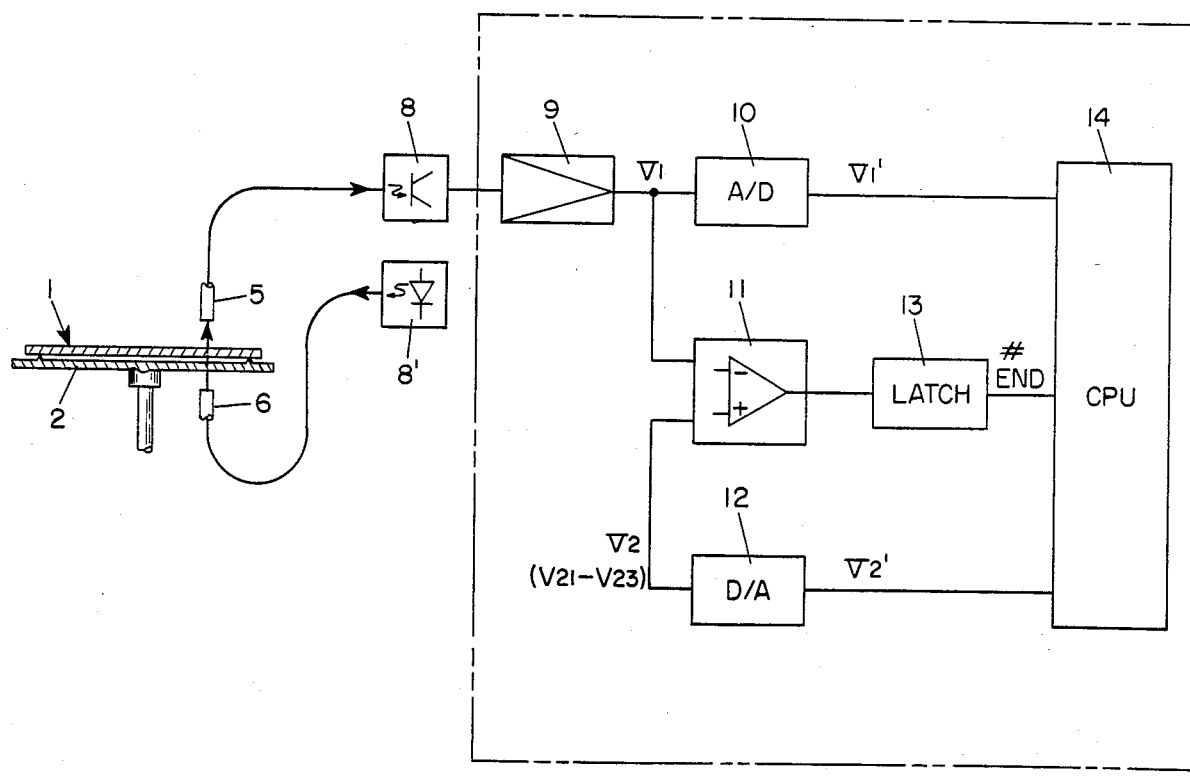
FIG. 5 is a schematic diagram, partly in section, showing one mode of forming a substantial part of an apparatus used for the embodiment of the method in accordance with this invention.

A detector part (S) for detecting the quantity of transmitted light comprises a light receiving optical fiber (5) and a light projecting optical fiber (6) arranged respectively facing to the upper side and the lower side of the plate (1) placed horizontally on the holding pins (4) and each one end of said optical fibers (5),(6) being connected with light receiving elements (8) and light emitting elements (8') respectively (see FIG. 5). Said detector part (S) also comprises a holder (7) for holding light receiving ends and light projecting ends of said optical fibers (5),(6) respectively.

In this respect, it is to be noted that both light receiving ends and the light projecting ends must be so held as to be free from being sticked by the etching solution out of an injection nozzle (not illustrated). It is also allowable to arrange the light emitting elements (8') directly facing to the light receiving end of the light receiving fiber (5) omitting the light emitting fiber (6).

Figure 1:
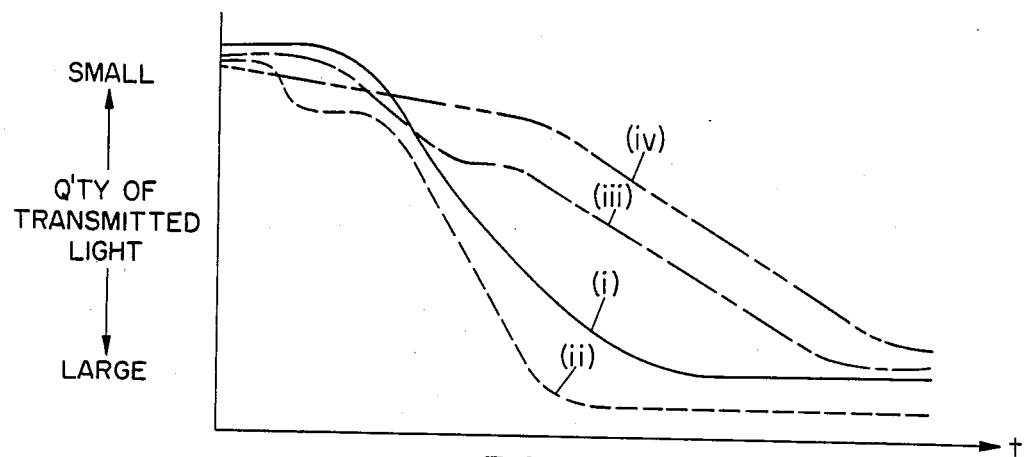
FIGS. 1 and 2 are characteristic curves showing the variation in the quantity of transmitted light applied to various kinds of plates to be treated with the lapse of treatment time t.
Figure 2:
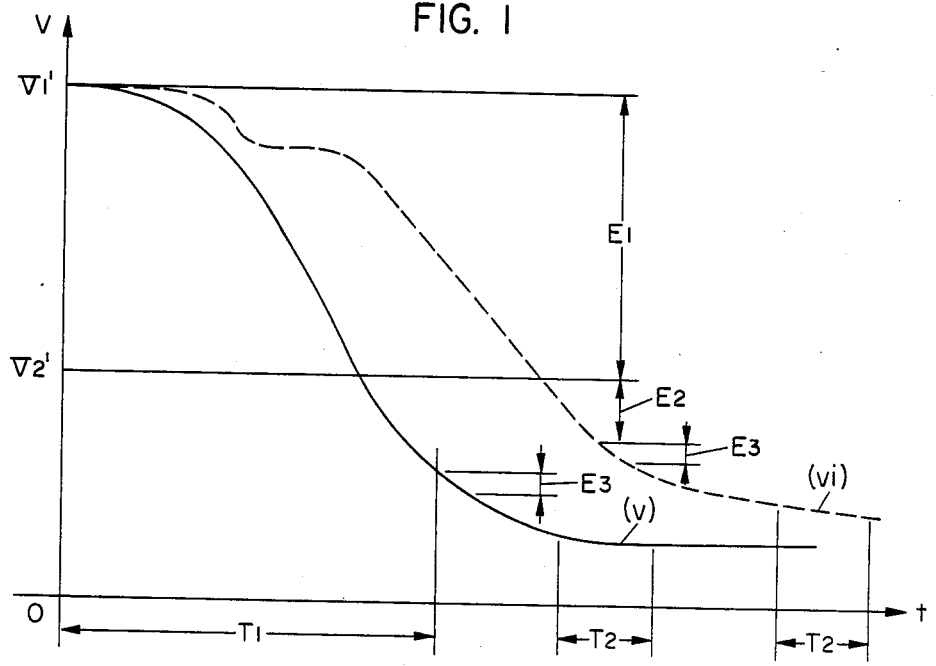

Referring then to FIG. 5 showing one mode of forming a substantial part of an apparatus used for the embodiment of the method in accordance with this invention, the light receiving elements (8) are photoelectric transfer elements which transfer the light transmitted through said light receiving fiber (5) into a quantity of electricity (or voltage) in proportion to the quantity of transmitted light. In this embodiment, as shown in FIG. 2, when the quantity of light received by the light receiving fiber (5) is increased, the output voltage of said photoelectric transfer elements (8) is decreased. An output $V_1$ of an amplifier (9) for amplifying the output of said transfer elements (8) is input to an A/D converter (10) and also to one terminal of the comparater (11). To another terminal of the comparater (11) an output $V_2$ of a D/A converter (12) is input as a reference voltage $V_2$, and when said output $V_1$ is below the reference voltage $V_2$, a discrimination signal (Ep) is output. This discrimination signal (Ep) is held by a latch circuit (13) for a fixed period of time and is input to a CPU (14) as an END signal described hereinafter. The CPU (14), according to the level of the detected quantity of transmitted light, performs a selection of reference level value among the predetermined values $E_1$, $E_2$, $E_3$ which are set up or stored in the incorporated memory beforehand, and then performs an operation corresponding to an equation $V_{n+1} = V_n - E_{1 \sim 3}$ so that the valve obtained by said operation is output to the comparater (11) as an analog reference volatage $V_{n+1}$ through said D/A converter (12), and based on the END signal output to the CPU (14) and on the fixed period of time set up to the incorporated timer, the state of surface treatment of the plate (1) to be treated is accurately detected.

Figure 6:
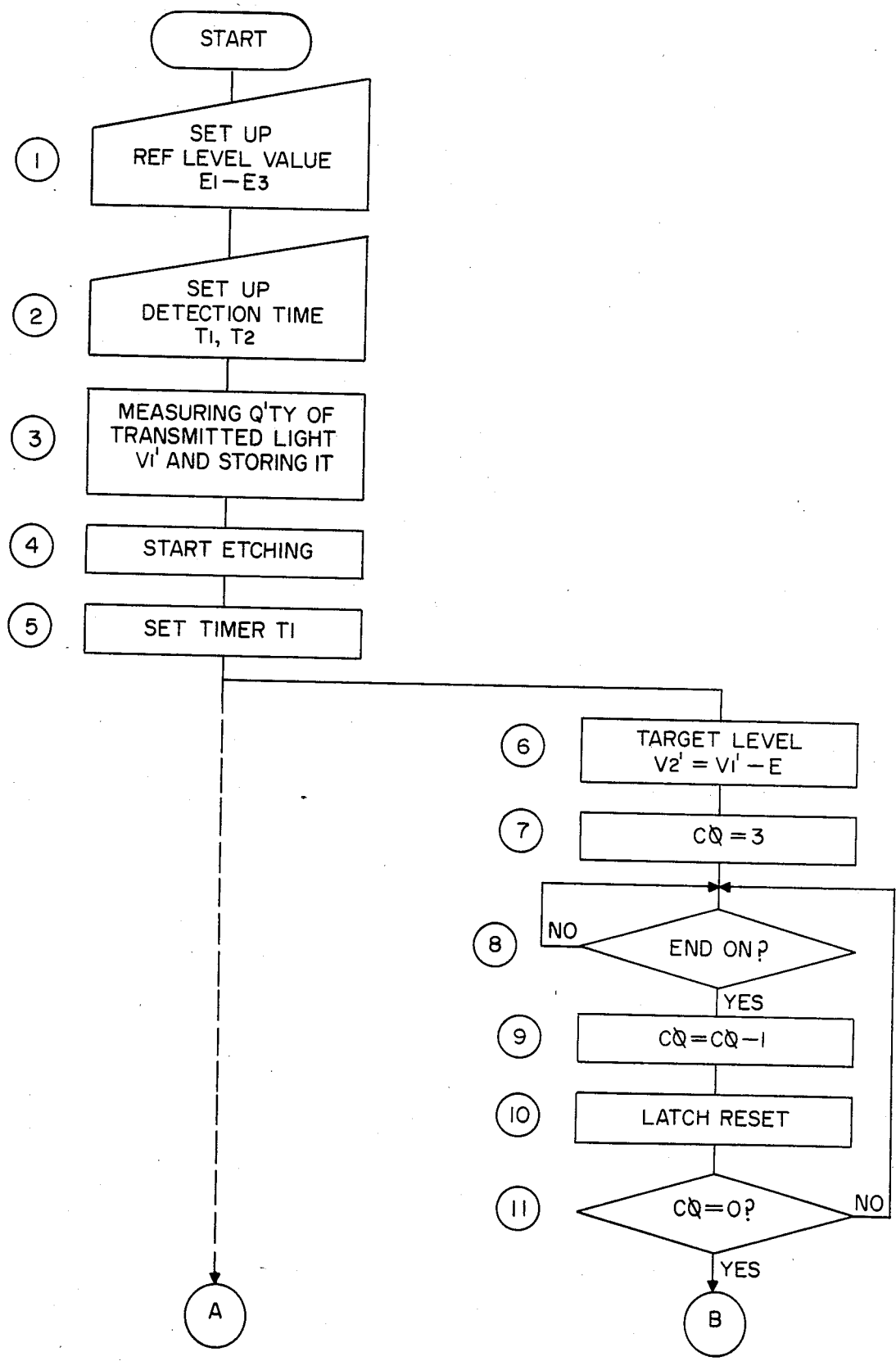
FIGS. 6, 7 and 8 are flow charts showing one embodiment in accordance with this invention.
Figure 8:
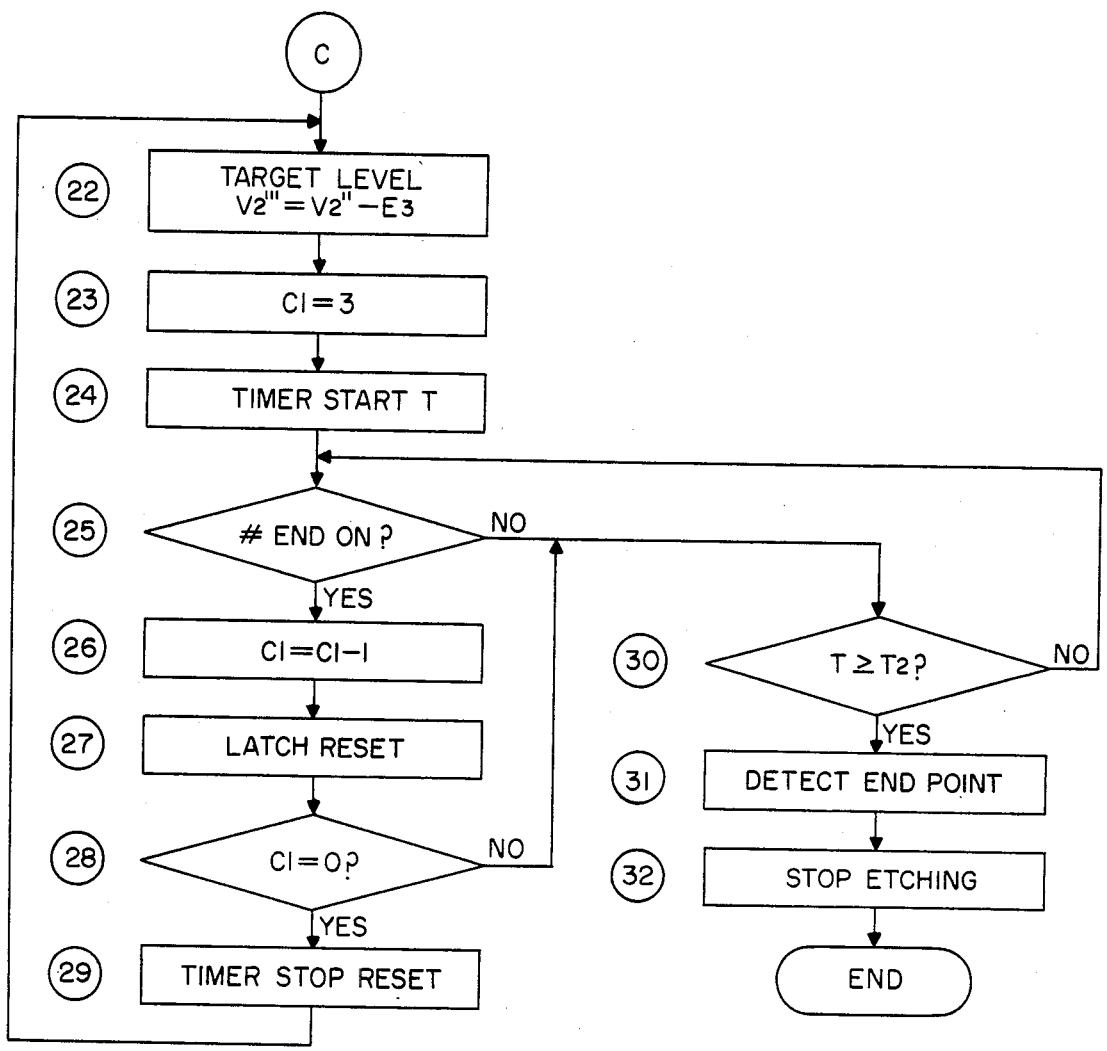

Referring now to FIGS. 6 and 8 illustrating flow charts to show the specific procedure of embodying this invention using the foregoing apparatus, in the first place, a plurality of reference level values (or the level values to be reference levels for detecting the state of surface treatment) $E_1$, $E_2$, $E_3$ and the detection times $T_1$, $T_2$ are set up respectively (step 1 and step 2). The foregoing reference level values $E_1$, $E_2$, $E_3$, as well as detection times $T_1$, $T_2$ are to be appropriately selected through an experiment or test. In this invention, however, in order to increase or promote the accuracy in the detection of treatment with the progress of etching process, said values and times are set up to be as follows:

$$E_1 > E_2 > E_3 \quad T_1 > T_2$$

After completing the set up, the quantity of transmitted light proper to the plate (1) to be treated is measured before the treatment and the detected level ($V_1'$) obtained by the measurement is stored in the memory of the CPU (14)(step 3). Then the etching treatment is started (step 4) and at the same time the timer as well (step 5). It is preferred that the time ($T_1$) set up by the timer is so selected as to be a time within which each characteristic in the quantity of transmitted light becomes stable as shown in FIG. 2, for example.

It is also preferred that the time of the treatment can be controlled by counting the required pulse signals using an adequate counter.

Then an operation of $V_2' = V_1' - E_1$ is performed using the reference level value $E_1$ stored in the memory incorporated in the CPU (14), and the value obtained by said operation to be a reference voltage (or a taget level) is input to one terminal of the comparater (11) through the D/A converter (12) (step 6).

At this moment, as the spinner head is being rotated or turned at a constant speed with the start of etching treatment, the light beam from the light source (8') irradiated by the light projection fiber (6) is interrupted by the arms (2) shown in FIG. 3 periodically at the interval of every quarter rotation or turn, thereby the detected value of the output signals from the photoelectric transfer elements (8) renders a periodical variation as shown in FIG. 9. In this FIG. 9, $V_0$ shows a detected level of the output signal from the photoelectric transfer elements (8) at the moment when the irradiated light beam is interrupted by the arms (2), and $V_1$ shows a detected level of the output signal from the photoelectric transfer elements (8) at the moment when the transmitted light beam on the plate (1) to be treated is received before the etching treatment.

As the etching treatment on the plate (1) goes on, the quantity of transmitted light of the light beam irradiated to the plate (1) is gradually increased resulting in the output of pulse signals as shown in FIG. 9 from the photoelectric transfer elements (8). Said output is performed at the interval corresponding to the mask pattern applied to the plate (1) i.e. the part remaining the photoresist and to the part where the photo resist is eliminated, respectively.

The CPU (14), taking the END signal latched on the said latch circuit (13) based on the control program for an initial value in the calculation, sets up an incorporated register for "3", for example (step 7), and then checks repeatedly whether there still be the END signal (step 8). When the etching treatment goes on and the level of pulse signals output from the photoelectric transfer elements (8) comes to exceed the signal level of $V_2' = V_1' - E_1$ i.e. the target level as shown in FIG. 9, the discrimination signal (Ep) is output from the comparater (11), which is latched on the latch circuit (13) to be input to the CPU (14) as said END signal. The CPU (14), when detecting the END signal, decreases said initial value "3" in the register of the CPU (14) by "1" (step 9), and then the latch circuit (13) is reset according to the command from the CPU (14) (step 10). Then, the content of said register is checked whether it becomes "0" or not (step 11), and when said content is found not "0", the CPU (14) checks whether there is the END signal or not returning to the step 8. When the content of said register is found "0", the CPU (14) stands a flag E on the predetermined register indicating that the first target level $V_2'$ is completely exceeded or cleared (step 12). In this case, it is preferred that the output pulse signals exceed the target level consecutively. In the next step the CPU (14) checks whether a flag T stands or not (step 13). This flag T is set by the CPU (14) through an interruption process when said timer stops (step 14), and at the same time the CPU (14) checks whether the flag E stands or not (step 15). Through this check, when the flag E is found standing, the process jumps to the step 22 described hereunder disregarding the process already performed, and when the flag E is found not standing moves to the next step 16. In the same manner when the flag T is found standing by the check in said step 13, the process jumps to the step 22 described hereunder, and when the flag T is found not standing by the check in said step 13 moves to the next step 16. More particularly, as shown in FIG. 2(v), when the detected level on the plate (1) to be treated is found exceeding the first target level $V_2'$ before passing the time $T_1$, the treatment process jumps to the step 22 and checks the variation in the detected values corresponding to the quantity of transmitted light on a narrower reference level ($E_3$) as shown in FIG. 2. When the detected level is found not exceeding the first target level $V_2'$ after passing the time $T_1$ as shown in FIG. 2(vi), the variation in the detected levels corresponding to the quatity of transmitted light is checked by reducing said reference level with gradual step ($E_2 \rightarrow E_3$). Thus, the detection of the state of the treatment can be accomplished closely and accurately corresponding to the progress of etching treatment.

Figure 7:
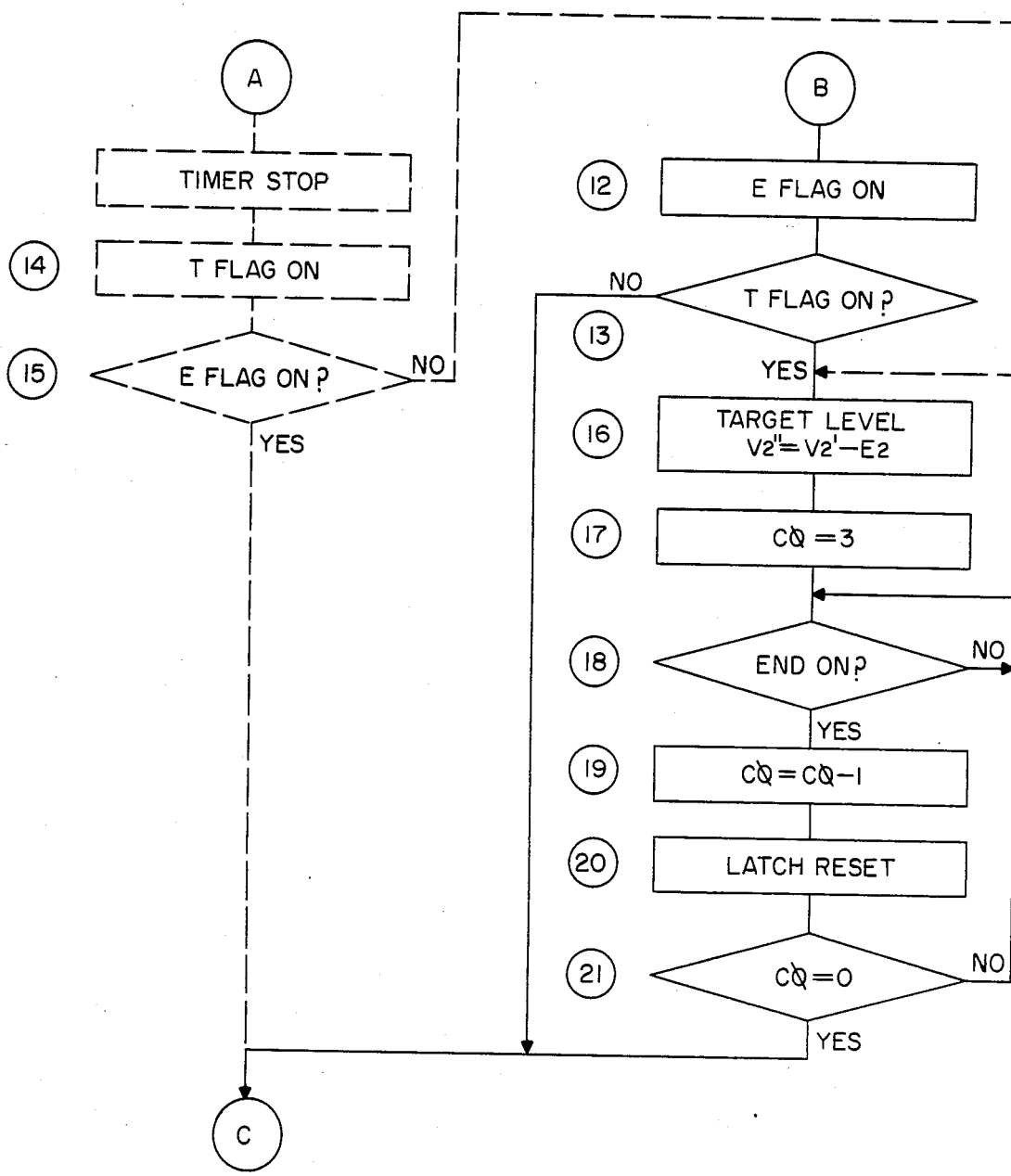

Now referring to the flow chart of FIG. 7, when the flag T is found standing as the result of the check in step 13, the CPU (14) performs an operation of $V_2'' = V_2' - E_2$ for the next target level $V_2''$, and the value thus obtained is input to the comparater (11) through the D/A converter (12) (step 16). After passing the processes same as the steps 7 through 11, the process jumps to the step 22, in which the CPU (14) performs an operation of $V_2''' = V_2'' - E_2$ for the next target level $V_2'''$, and the value thus obtained is input to the comparater (11) through the D/A converter (12) in the same manner as said step 16. Then, as the initial value for the calculation of the END signal, the register in the CPU (14) is set up for "3", for example (step 23) and the timer is started (step 24). Said steps are taken so that the variation thereafter in the detected levels on the plate (1) is detected limiting the detection time to $T_2$.

Then, the CPU (14) checks whether there is the END signal or not in the latch circuit (13) (step 25), and when the END signal is found output, the processes same as the steps 19 through 21 are carried out in the steps 26 through 28. when the content set up to the register is found "0" as the result of the check in the step 28, said timer is reset to return to the step 22, and the next target level $V_2''''$, the operation of $V_2''''=V_2'''-E_3$ is performed in the CPU (14) so that the value thus obtained is input to the comparater (11).

When the END signal is found not latched on the latch circuit (13) as the result of the check in the step 25, the CPU (14) checks whether the time is over or not in the step 30, and when the time over is not found, returning to the step 25, the CPU (14) checks whether there is the END signal or not (step 29).

In this manner, each process from said steps 22 to 29 is repeated while gradually renewing the reference value to a lower level in order until the variation in the quantity of transmitted light on the plate (1) to be treated is not found any more, i.e. until the END signal latched on the latch circuit (13) corresponding to the discrimination signal (Ep) from the comparater (11) comes to be not output.

When the operating time of the timer is found over said detection time $T_2$ as the result of the check in the step 30, it can be considered that the etching treatment is completed and therefore taking this moment for the end point of the treatment (step 31), the etching treatment is stopped (step 32).

In the above described first embodiment, the renewed target level to be operated by the CPU (14) is established or set up by subtracting the reference level value $E_2$ or $E_3$ from the previous level. In accordance with this invention, however, the method of setting up the target level is not limited to the mentioned one. It is also possible to set up a new target level in another method comprising a step of detecting the pulse signal level output during the surface treatment as shown in FIG. 9 using the CPU (14), and a step of subtracting the reference level value $E_2$ or $E_3$ from the minimum or lowest level in the pulse signal levels. In this case, there is an advantage that the set up of the target level can be performed with higher efficiency. More particularly, in case of the above first embodiment, only the number of pulses exceeding the target level is detectd and the level itself not. Accordingly it is not checked whether the next target level to be set up is exceeded by the pulse signals or not, and if the next target level to be set up is found exceeded by the pulse signals, it is of no use setting up such target level. In consequence, on the set up of a new target level, it will be more practical to set up the new target level by subtracting the reference level value $E_2$ or $E_3$ from the minimum or lowest level of the pulse signals which exceeds the latest target level.

It is further possible, partly in relation to an embodiment described hereinafter, to adopt such a method comprising a step of averaging the pulse signal levels output corresponding to the quantity of transmitted light or reflected light on each of the regions (4 regions in the embodiment hereto) divided by the arms (2) of the spinner head, a step of setting up a next new target level when those pulse signals exceed the predetermined target level consecutively four times, for example, a step of repeating the set up of such target level as the case may be, and a step of determining the end point of the surface treatment at the moment when said pulse signal is found exceeding the target level consecutively four times, for example, within a predermined period of time.

Referring then to FIGS. 10 and 11 showing another embodiment other than that of FIGS. 3 and 4, and in which schematic diagrams of stationary arm holder of the spinner head used for emboding this invention are illustrated, the spindle (SP) is fixedly provided with a disk (17) having the same number of segmental parts (18) as the arms (2). In order to detect the segmental parts (18) of the disk (17), a photosenser (16) is provided facing to the disk (17).

Figure 13:
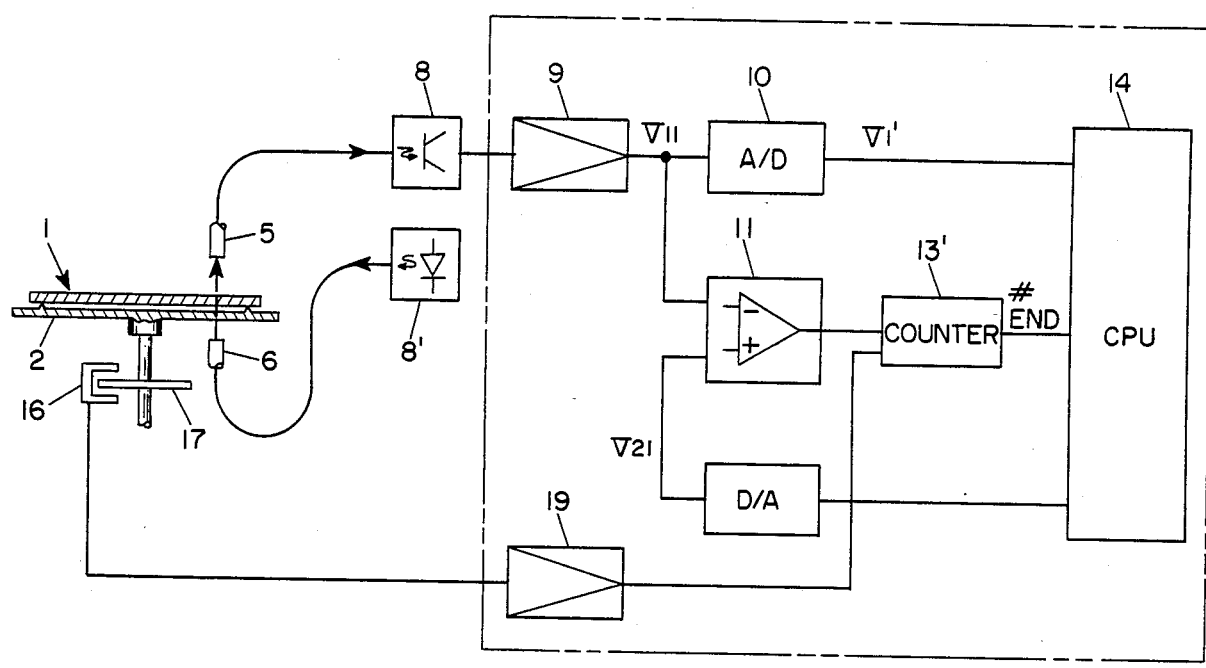
FIG. 13 is a schematic diagram, partly in section, showing one mode of forming a substantial part of another apparatus used for the embodiment of the method in accordance with this invention.
Figure 14:
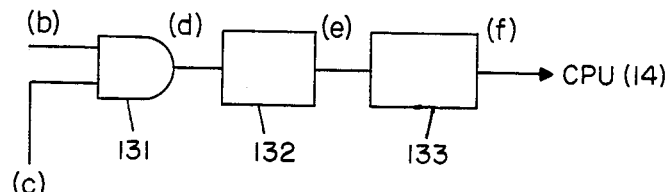
FIGS. 14 and 15 are a block diagram and a timing chart respectively showing one embodiment of a counter circuit of FIG. 13.

Referring to FIG. 13 showing a schematic diagram of an apparatus used for embodying such example other than that of FIG. 5, the output signal $V_1$ which is input from the amplifier (9) to one terminal of the comparater (11) is compared with the output signal $V_2$ which is input from the CPU (14) to another terminal of the comparater (11) through the D/A converter (12) as a reference voltage, and when the former $V_1$ exceeds the latter $V_2$, the pulse-like discrimination signal (Ep) is output. Then, said discrimination signal (Ep) which is output from the comparater (11) is input to a counter circuit (13') and is input from the counter circuit (13') to the CPU (14) as the END signal after being processed as described hereunder. The CPU (14) selects the predetermined reference level values $E_1$, $E_2(E_1>E_2)$ set up to the incorporated memory beforehand, and performs an operation corresponding to the equation $V_{n1}=V_{(n-1)1}+E_1$ ($n=2, 3, \ldots$). The value thus obtained is set up to the comparater (11) through said D/A converter (12) as an analog reference voltage (or a target level) $V_{n1}$, and based on said END signal input to the CPU (14) and on the predetermined time set up to the incorporated timer, the state of treatment of the plate (1) can be detected.

Figure 15:
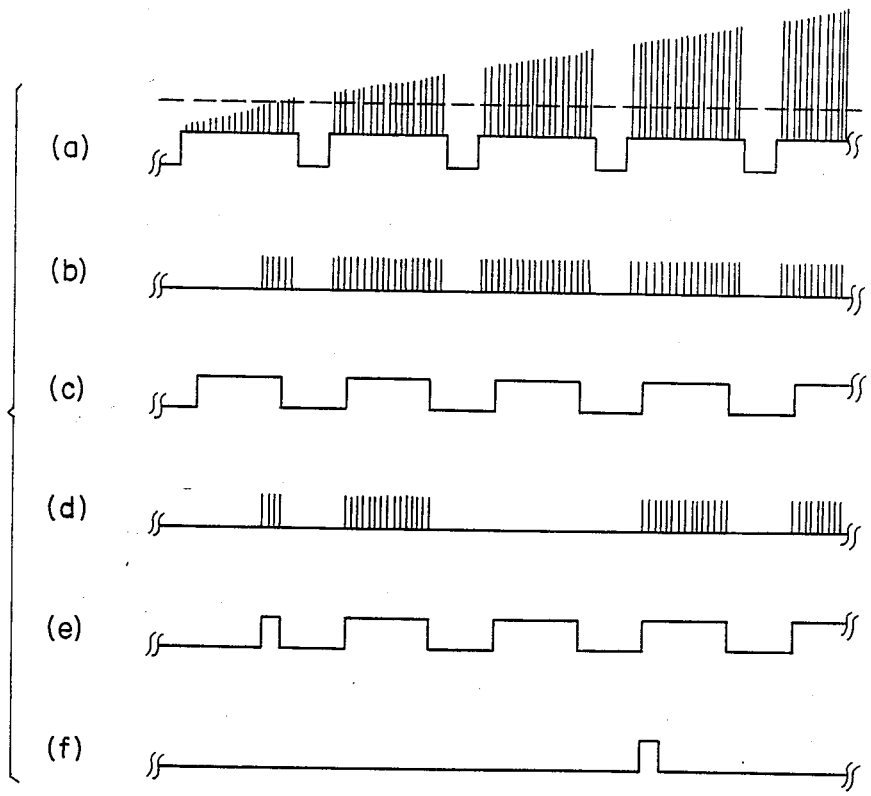

Said counter circuit (13') can be comprised of an AND gate (131), a flip-flop (F/F) circuit (132) and a counter (133), and after comparing with the target level (indicated by a dotted line in FIG. 15(a)) in the comparater (11), only the detected signal exceeding the target level comes to be input as the discrimination signal (Ep) as shown in FIG. 15(b). Said discrimination signal (Ep) is output as the pulse-like signal as shown in FIG. 15(d) from the AND gate (131) during the particular period when the AND gate (131) is open by a gate signal (shown in FIG. 15(c)). Said output from the AND gate (131) is then set the F/F circuit (132) for "1" (the F/F circuit (132) is reset by the last transition of the gate signal), the pulse signals as shown in FIG. 15(e) being output from the F/F circuit (132), those pulse signals then being counted by the counter (133) and the counter outputting the END signal as shown in FIG. 15(f) when the counted number reaches to the predetermined number (4, for example). In this respect, the counter (133) is so formed as to be reset by the pulse signals corresponding to one rotation of the spinner head (2).

Figure 16:
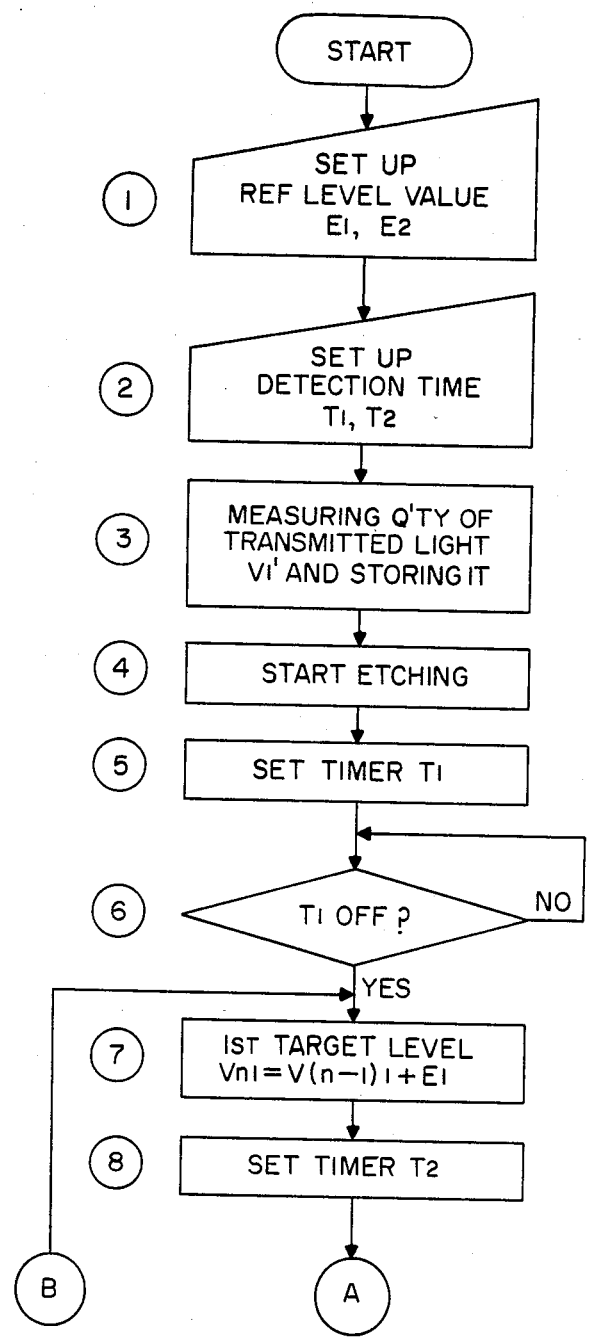
FIGS. 16 and 17 are flow charts of the embodiment of FIG. 13 respectively.
Figure 17:
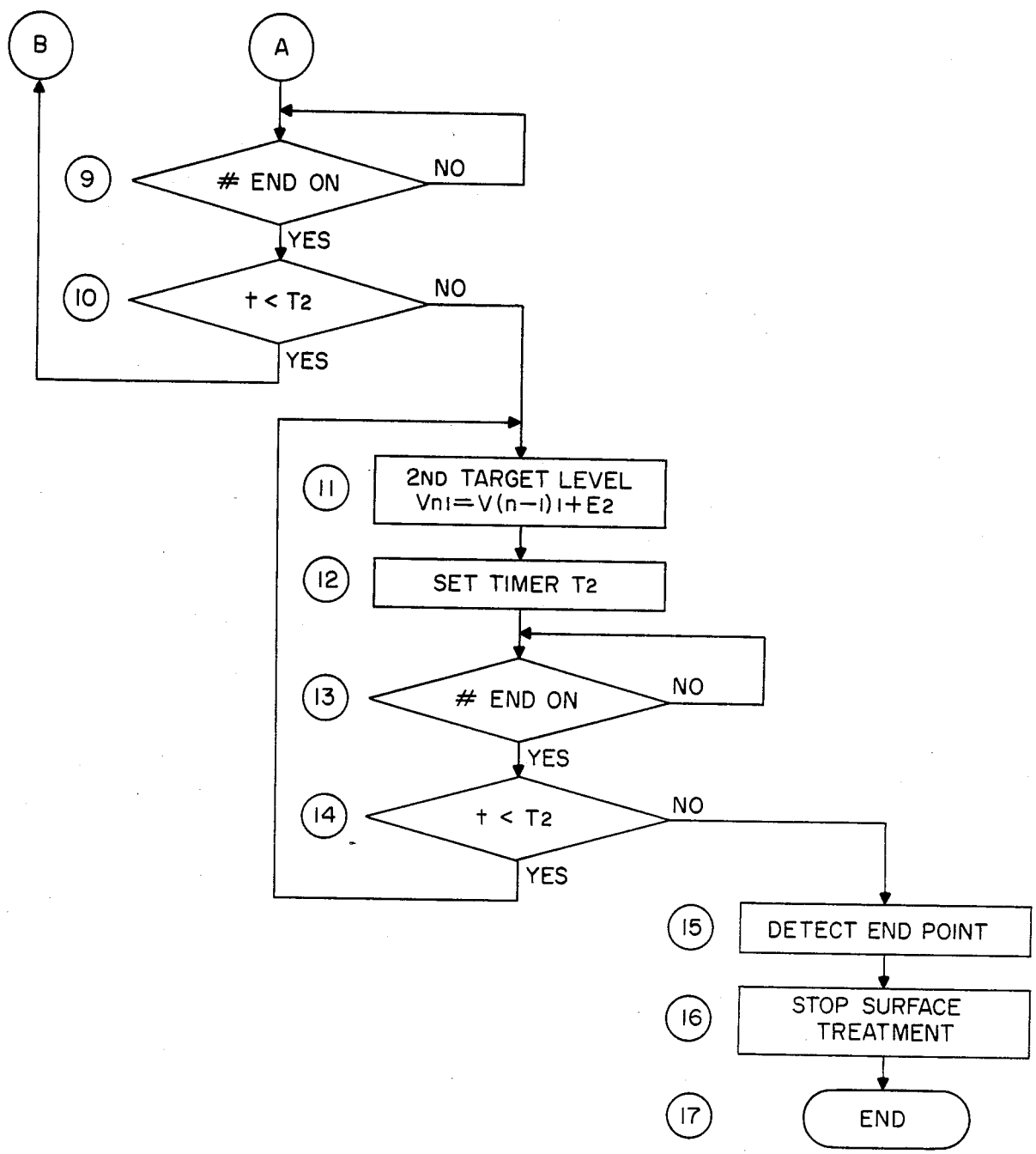

Referring to FIGS. 16 and 17 showing a flow chart respectively, a procedure of embodying this invention using the apparatus shown in FIG. 13 is now described hereunder. As the steps 1 to 5 are quite the same as the foregoing first embodiment, the description thereof is omitted here. With respect to the time $T_1$ to be set up to the timer, it is preferred to be selected before the variation in the quantity of transmitted light comes to appear due to the etching applied onto the surface of the plate (1).

When the initialization time $T_1$ has passed (step 6), the CPU (14) performs an operation of $V_{21}=V_{11}+E_1$ using the first reference level value $E_1$ stored in the memory therein, and the value thus obtained is input to one terminal of the comparater (11) through the D/A converter (12) as the reference voltage (or a target level) (step 7). Then the timer $T_2$ is set (step 8).

Figure 18:
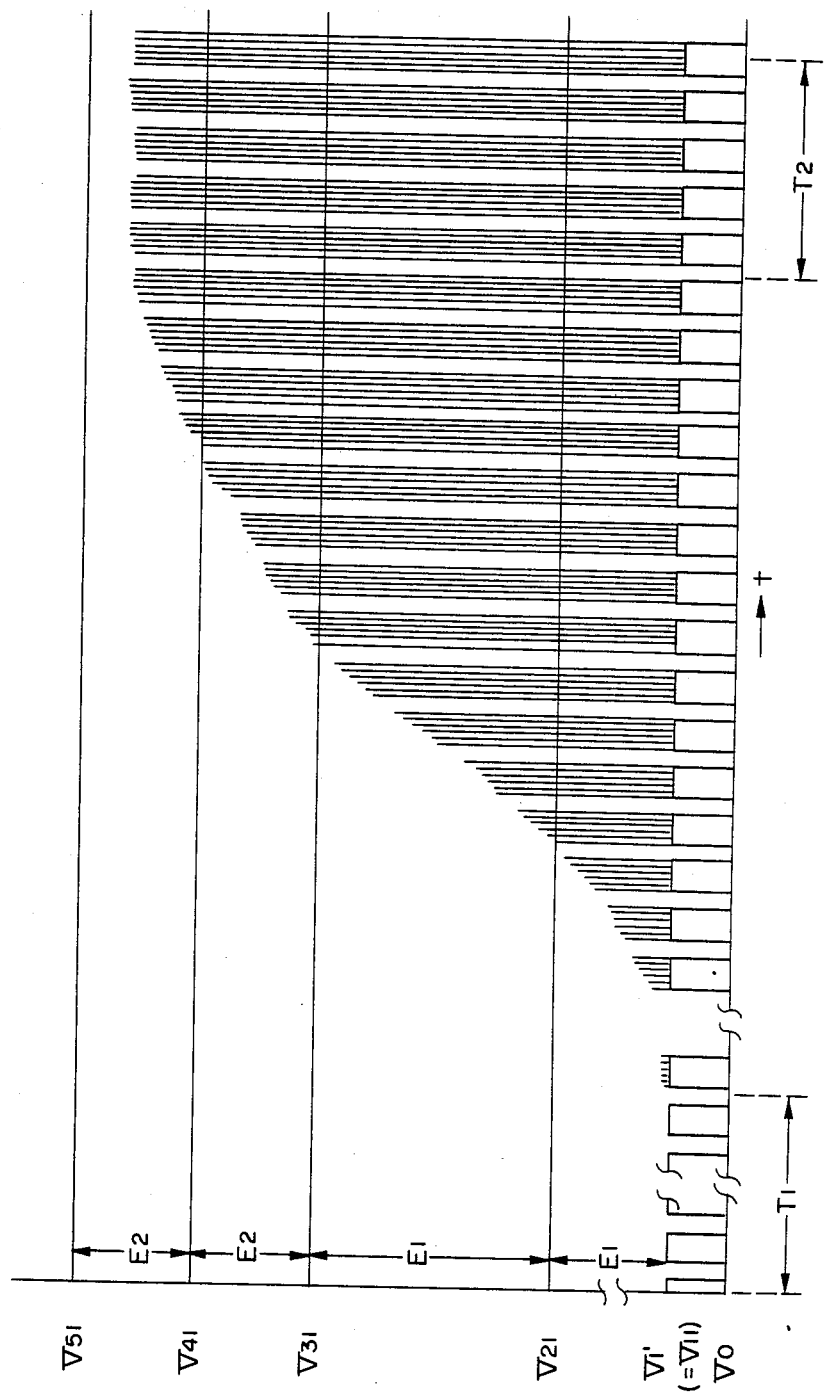
FIG. 18 is a diagram showing one example of detected signals with the lapase of treatment time.

The etching treatment is started at the step 4, and as the treatment goes on, the quantity of transmitted light flux irradiated to the plate (1) is gradually increased, and the pulse-like signals as shown in FIG. 18 are output from the photoelectric transfer elements (8), the details of which are the same as mentioned first embodiment.

Thus, when passing said set up time $T_1$ in the timer, the detected signal level is compared with the target level $V_{21}$ in the comparater (11) to check whether the detected level exceeds the target level $V_{21}$ or not. When the detected level is found exceeding the target level $V_{21}$, the discrimination signal (Ep) is output from the comparater (11) to the counter circuit (13'). In this counter circuit (13'), as decribed above, the F/F circuit (132) is set on each of the regions divided by the arms, for example, by the discrimination signal (Ep) to generate the pulse signals. When the pulse signals are input to the counter (133) consecutively four times, for example, the counter circuit (13') outputs the END signal to the CPU (14) (step 9). Said step 9 is taken just for confirming that the same degree or level of treatment is proceeding evenly with respect to every region or area of the plate (1) divided by the arms (2) of the spinner head. In case that the actual time t is shorter than the set up time $T_2$, the CPU (14) resets the first target level for $V_{31} = V_{21} + E_1$. At the same time the timer is also reset for $T_2$ (step 10).

In this manner, after repeating the steps 7 through 10 to set up a new target level and when the time t required for the pulse signals shown in FIG. 15(e) to be counted consecutively four times, for example, by the counter (133) of the counter circuit (13') becomes longer that the set up time $T_2$, the process goes from step 10 to step 11 in order to set up the second target level $V_{n1} = V_{(n-1)1} + E_2$ based on the first target level (step 11). Here it is to be noted that $E_2$ is the second reference level value remarkably smaller than the first reference level value $E_1$.

When the timer is simultaneously set up for $T_2$, the detected level being compared with the target level, and the pulse signals from the F/F circuit (132) in the counter circuit (13') being counted consecutively four times, for example, in other words, when, on every region or area of the plate (1) divided by the arms (2), the detected level corresponding to the quantity level of the transmitted light on each said area exceeds the target level, the counter circuit (13') outputs the END signal to the CPU (14). In this case, when the time t is longer than the set up time $T_2$, the process moves to step 15 and at this moment the end point of the surface treatment is determined to stop the treatment.

Although in the flow chart as to said embodiment, the end point of the surface treatment is detected at the second target level $V_{n1} = V_{(n-1)1} + E_2$, the thrid target level, the fourth target level and so forth can be further set up as the case may be. In FIG. 10, four arms (2) are used for securely holding the plate (1) to be treated, however, three such arms are of course available in the embodiment of this invention. In case of three arms, the END signal is generated in the counter circuit (13') when the counter (133) counts the pulse signals from the F/F circuit (132) consecutively three times.

In both of two embodiments described above, the end point of the surface treatment is detected based on the variation in the quantity of transmitted light of the plate to be treated. It is further possible that the end point of such surface treatment is detected based on the variation in the quantity of reflected light on the plate to be treated. Furthermore, the method in accordance with this invention is not only applicable to the etching treatment of a plate but also to the detection of end point in the developing process of a base plate or the like.

It should also be understood that the foregoing relates to only a preferred embodiment of this invention, and that it is intended to cover all changes and modifications of the examples of the invention herein chosen for the purpose of the disclosure, which do not constitute departures from the spirit and scope of this invention.

What is claimed is:

1. In a method of surface treatment irradiating a predetermined part of a plate of which surface is to be treated with light flux, detecting a quantity of transmitted light or a quantity of reflected light on the plate to be treated corresponding to said light flux, and detecting an end point of said surface treatment based on the variation in the detected signal level, the combination with said steps of a step of detecting whether said detected signal level exceeds a predetermined target level or not within a predetermined period of time, a step of repeatedly setting up a new target level so long as the detected signal level is found exceeding the predetermined target level, and a step of determining the end point of said surface treatment at the moment when said detected signal level is found not exceeding the new target level.

2. A method of surface treatment claimed in claim 1, wherein the target level to be repeatedly set up is constant.

3. A method of surface treatment claimed in claim 1, wherein the target level to be repeatedly set up is operated each time according to the quantity of transmitted light or reflected light.

4. A method of surface treatment claimed in claim 1, wherein the target level to be set up is selective according to the progress of the surface treatment.

5. In a method of surface treatment irradiating a predetermined part of a plate of which surface is to be treated with light flux, detecting a quantity of transmitted light or a quantity of reflected light on the plate to be treated corresponding to said light flux, and detecting an end point of said surface treatment based on the variation in the detected signal level, the combination with said steps of a step of gradually detecting whether said detected signal level exceeds a predetermined target level or not consecutively at a predetermined frequency within a predetermined period of time, a step of repeatedly setting up a new target level so long as the detected signal level is found exceeding the predetermined target level, and a step of determining the end point of said surface treatment at the moment when said target level is found not exceeding the new target level consecutively at a predetermined frequency within a predetermined period of time.

6. A method of surface treatment claimed in claim 5, wherein the target level to be set up is selective according to the progress of the surface treatment.

7. A method of surface treatment claimed in claims 1, 2, 3, 4, 5 or 6, wherein the surface treatment applied to the plate to be treated is an etching.

8. A method of surface treatment claimed in claims 1, 2, 3, 4, 5 or 6 wherein the surface treatment applied to the plate to be treated is a development.

* * * * *